US008168952B2

(12) United States Patent
Houde-Walter

(10) Patent No.: US 8,168,952 B2
(45) Date of Patent: May 1, 2012

(54) TARGET MARKER HAVING QUANTUM CASCADE LASER FOR THERMALLY MARKING A TARGET

(75) Inventor: Susan Houde-Walter, Rush, NY (US)

(73) Assignee: LaserMax, Inc., Rochester, NY (US)

( * ) Notice: Subject to any disclaimer, the term of this patent is extended or adjusted under 35 U.S.C. 154(b) by 0 days.

(21) Appl. No.: 13/240,435

(22) Filed: Sep. 22, 2011

(65) Prior Publication Data

US 2012/0006986 A1    Jan. 12, 2012

Related U.S. Application Data

(63) Continuation of application No. 12/779,250, filed on May 13, 2010, now Pat. No. 8,067,734, which is a continuation of application No. 11/464,094, filed on Aug. 11, 2006, now Pat. No. 7,732,767.

(51) Int. Cl.
*G01J 5/02* (2006.01)
(52) U.S. Cl. .................. 250/330; 250/338.1
(58) Field of Classification Search .......... 250/330, 250/332, 334, 338.1, 339.01, 339.06
See application file for complete search history.

(56) References Cited

U.S. PATENT DOCUMENTS

| | | | |
|---|---|---|---|
| 4,737,028 A | 4/1988 | Smith | |
| 4,738,044 A | 4/1988 | Osterhout | |
| 5,064,988 A | 11/1991 | E'nama et al. | |
| 6,359,681 B1 | 3/2002 | Housand et al. | |
| 6,690,472 B2 | 2/2004 | Kulp et al. | |
| 6,765,663 B2 | 7/2004 | Byren et al. | |
| 6,803,577 B2 | 10/2004 | Edner et al. | |
| 6,903,343 B2 | 6/2005 | Amon et al. | |
| 7,492,806 B2 | 2/2009 | Day et al. | |
| 2002/0105699 A1 | 8/2002 | Miracky et al. | |
| 2003/0174315 A1 | 9/2003 | Byren et al. | |
| 2005/0207943 A1 | 9/2005 | Puzey | |
| 2005/0213627 A1 | 9/2005 | Masselink et al. | |
| 2006/0268947 A1 | 11/2006 | Kalayeh | |
| 2007/0030865 A1* | 2/2007 | Day et al. .......... | 372/4 |

OTHER PUBLICATIONS

QCL FAQ List, Alpes Lasers SA, Aug. 4, 2005, http://www.alpeslasers.ch.
Tiny tunables heat up the Mid-IR lasers for OEM applications, 2006, www.daylightsolutions.net.
Tiny tunables room-temperature mid-IR lasers for OEM applications, 2008, www.daylightsolutions.net.
Tunable MID-IR External Cavity Laser, Daylight Solutions, www/daylightsolutions.net, at least as early as Aug. 11, 2006.
Mid-IR Interband Cascade Laser, Maxion Technologies, Inc., www.maxion.com, at least as early as Aug. 11, 2006.
Laser Systems, GLTD II, DS-169-DAF-0102, Northrop Grumman Electronic Systems, www.northropgrumman.com, at least as early as Aug. 11, 2006.
Faist, Jerome, Continuous-Wave, Room-Temperature Quantum Cascade Lasers, OPN May 2006, www.osa-opn.org.

(Continued)

*Primary Examiner* — Mark R Gaworecki
(74) *Attorney, Agent, or Firm* — Finnegan, Henderson, Farabow, Garrett & Dunner LLP

(57) ABSTRACT

A portable target marker includes a quantum cascade laser configured to generate a thermal infrared beam. The target marker also includes a driver operably connected to the quantum cascade laser and configured to pulse the beam at a desired repetition rate. The pulsed beam intersects a target. The target marker further includes a thermal imager configured to form a visible image of the pulsed beam intersecting the target.

20 Claims, 3 Drawing Sheets

OTHER PUBLICATIONS

Equipment for operating distributed-Feedback-Laser and Fabry-Perot Laser, at least as early as Aug. 11, 2006.

Page et al., "Demonstration of GaAs-Based Quantum Cascade Laser Operating on a Peltier Cooled Element," Jun. 2001, IEEE Photonics Technology Letters, vol. 13, No. 6, pp. 556-558.

Daylight Solutions Inc.'s Protest Under 37 C.F.R. § 1,291(a) 18 pp, Jan. 28, 2010.

Mutual Nondisclosure Agreement dated Jul. 13, 2008 and Jul. 18, 2006, respectively, 2 pp.

Email communications between Daylight Solutions Inc. and Lasermax, Nov. 29, 2006-Dec. 20, 2006, pp.

Weida, et al., Tunable QC laser opens up mid-IR sensing applications, Laser Focus World Jul. 2006, www.laserfocusworld.com, 2 pp.

Unsigned Consent of the Applicant for Protest Under 37 C.F.R. § 1,291(a), Jan. 28, 2010, 1 p.

Daylight Solutions Inc.'s Mar. 15, 2010 Protest Under 37 C.F.R. § 1,291(a), and exhibits B-D, 33 pp.

PCT—Notification of Transmittal of the International Search Report and the Written Opinion of the International Searching Authority, or the Declaration; Sep. 2, 2008.

International Search Report issued in corresponding International Application No. PCT/US07/75712, Sep. 2, 2008.

Written Opinion of the International Searching Authority issued in corresponding International Application No. PCT/US07/75712; Sep. 2, 2008.

USPTO Office Action dated Jul. 29, 2008, in corresponding U.S. Appl. No. 11/464,094.

USPTO Office Action dated Feb. 2, 2009, in corresponding U.S. Appl. No. 11/464,094.

USPTO Office Action dated Oct. 28, 2009, in corresponding U.S. Appl. No. 11/464,094.

Daylight Solution, Inc.'s Third Party Submission to USPTO Jan. 21, 2010, 3 pp.

\* cited by examiner

TARGET MARKER HAVING QUANTUM CASCADE LASER FOR THERMALLY MARKING A TARGET

CROSS-REFERENCE TO RELATED APPLICATIONS

The present application is a continuation of U.S. patent application Ser. No. 12/779,250, filed May 13, 2010, now U.S. Pat. No. 8,067,734 which is a continuation of U.S. patent application Ser. No. 11/464,094, filed Aug. 11, 2006, now issued U.S. Pat. No. 7,732,767. The entire disclosure of each of these prior related applications is expressly incorporated herein by reference.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

1. Field of the Invention

The present invention relates to marking a target, and more particularly, to a handheld and/or weapon mounted device incorporating a quantum cascade laser for generating and impinging a thermal infrared beam upon a target to create a corresponding image in a thermal imager.

2. Description of Related Art

In contrast to image enhancement technology typically employed in "night vision," "image intensifier" or "I$^2$" devices, thermal imaging does not require any ambient light or supplemental infrared illumination to illuminate a target or to produce an image.

That is, in a thermal imaging device, thermal infrared radiation (typically ranging from approximately 2 microns to 30 microns in wavelength) is captured and converted into a visible image. Objects with temperatures above 0° Kelvin emit light energy (black body radiation), a portion of which is in the thermal infrared spectrum. Thus, all objects above 0° K are theoretically viewable by a thermal imaging device.

In one form of a thermal imaging device (a micro-bolometer array), the infrared radiation (photons at the infrared wavelength) are impacted against a phased array of infrared detector elements, which creates a temperature pattern, often called a thermogram. The thermogram is translated into electrical impulses which are sent to a signal processing unit which translates the information into a display, wherein the image typically appears as various colors, depending upon the intensity and wavelength of the received infrared emission.

Since certain molecules reacts to specific wavelengths in a predictable manner, the use of thermal infrared radiation (and sensing of such radiation) provides a means for identifying or determining the presence of a selected molecules.

There are several classes of lasers that are capable of emitting radiation in the appropriate wavelength spectrum. However, these devices require cooling to a low temperature.

None of these lasers provide for a handheld, portable configuration operable at ambient or room temperature. Therefore, the need exists for a handheld portable target marker which can impinge a thermal infrared beam (at a wavelength between approximately 2 microns and 30 microns) upon the target, thereby identifying the target when viewed with a thermal imaging system.

BRIEF SUMMARY OF THE INVENTION

The present target marker provides a portable handheld or weapons mounted device including firearm-mounted device which can selectively create a beam of thermal infrared radiation having a wavelength which is viewable in a thermal imaging device. The target marker further provides for operation in a robust configuration at ambient temperatures found in field environments.

In one configuration, the target marker includes a handheld housing having an interior and an exterior; a quantum cascade laser retained in the interior of the housing for emitting a beam at a thermal infrared wavelength along a beam path; a driver retained within the housing and operably connected to the quantum cascade laser; a collimating or focusing lens connected relative to the housing and located in the beam path; and a power supply retained within the housing and operably connected to the quantum cascade laser.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings are not necessarily to scale, and sizes of various elements may be distorted for clarity. The drawings illustrate one or more embodiment(s) of the invention, and together with the description serve to explain the principles and operation of the invention.

BRIEF DESCRIPTION OF THE SEVERAL VIEWS OF THE DRAWING(S)

DETAILED DESCRIPTION OF THE INVENTION

Figure 1:
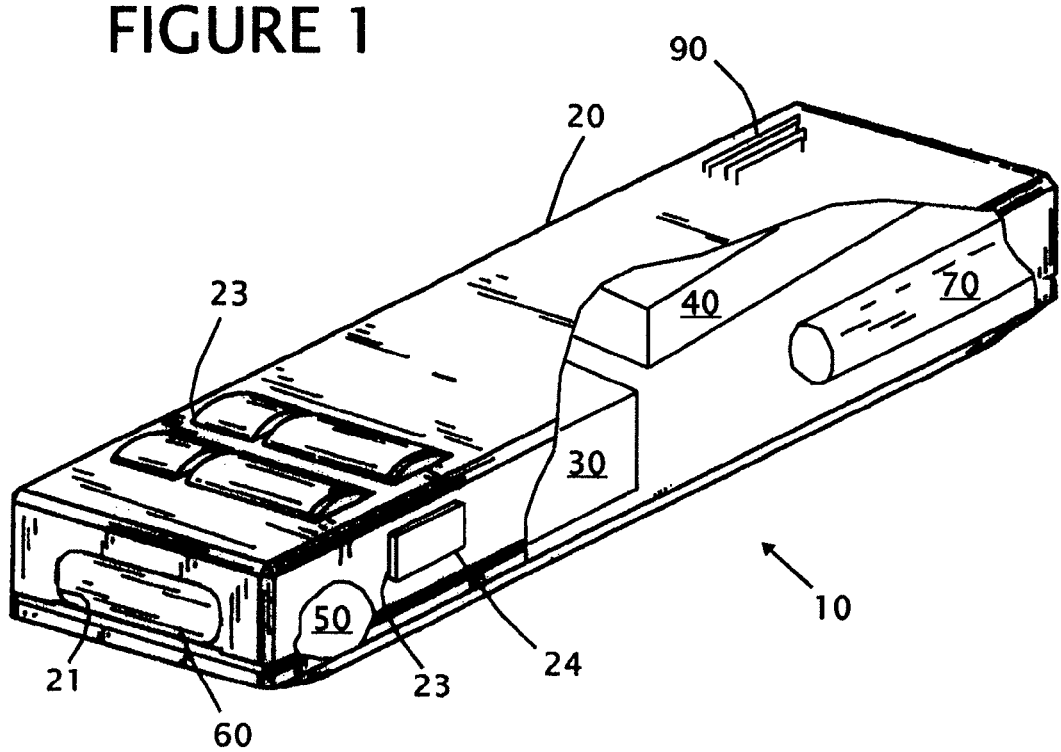
FIG. 1 is a partial cross sectional view of the target marker.
Figure 2:
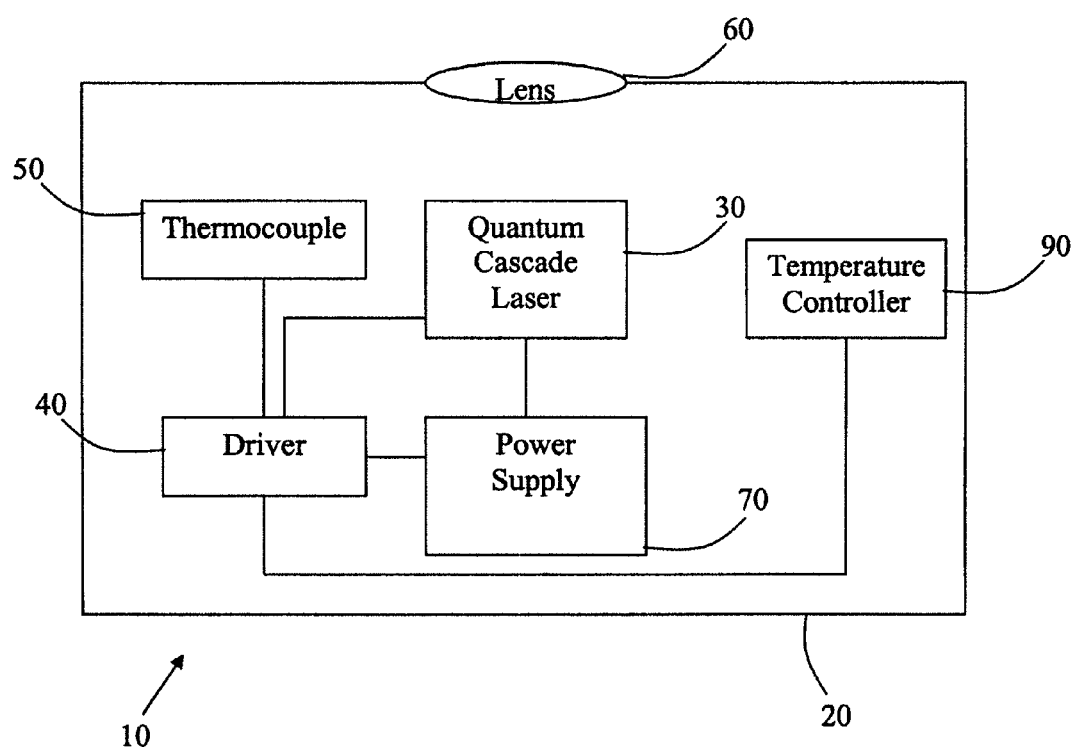
FIG. 2 is a schematic view of the operable components of the target marker.

Referring to FIG. 1, a target marker 10 for use with a thermal imager 300 is shown. Although the target marker 10 is shown as a separate and independent construction from the thermal imager 300, it is contemplated the target marker can be cooperatively or integrally connected to the thermal imager. For purposes of description, the target marker 10 is set forth as a separate, remotely deployable device from the thermal imager 300.

The thermal imager 300 is known in the art and can be any of a variety of configurations. The underlying sensing and display technology of the thermal imager 300 is well-developed and employed in devices made by DRS, Raytheon, ITT or BAE. "Thermal imaging" and "thermal detection" refers to imaging and detection in the electromagnetic spectral band of 2-30 microns. "Thermal infrared beam" refers to electromagnetic energy in the 2-30 micron wavelength range.

For purposes of disclosure, a brief description of the thermal imager 300 is provided. Generally, the thermal imager 300 includes four primary components retained within an imager housing, wherein the imager housing is configured to be carried by an individual.

The first primary component of the thermal imager 300 is a sensor (often referred to as a "camera") that reacts to infrared radiation, converting sensed thermal radiation (the "thermal picture") of an area into a visible thermal image in which, relative to the surrounding environment, hotter areas appear white while cooler areas appear black. One of two sensors is commonly used in portable thermal imagers: (1) a barium strontium titanate ("BST") detector developed by the Raytheon Company of Lexington, Mass. or (2) a microbolometer with a vanadium oxide (VOx) or an amorphous silicon sensing material, such as the LTC500 MicroIR™ Imaging Camera manufactured and distributed by BAE Systems of Nashua, N.H.

The second primary component the thermal imager 300 is a lens which focuses the thermal picture onto the sensor, and specifically onto a focal plane array ("FPA") of independent pixels. The quality of the lens is an important factor in the quality of the resultant thermal image. One measure of quality is the f-number. A wider lens means a smaller f-number and increased image quality. However, the width of the lens is limited by weight and costs considerations. For this reason, a common lens provides a field of view up to approximately 60°, and a common material for lens construction is germanium.

The third primary component the thermal imager 300 is the video display, the means by which the resultant thermal image is provided to the user. An active matrix liquid crystal display ("LCD") is commonly used in portable thermal imagers.

Finally, the fourth primary component the thermal imager 300 is a power supply. A NiMH or similar rechargeable battery can be used in portable thermal imagers, although alkaline or other common batteries can be also used.

The present target marker 10 can be employed to fulfill any of a variety of functions. Thus, the term "marker" includes a pointer, an aimer (or aiming device) as well as a designator (target designator). A pointer typically encompasses use of the target marker 10 to identify a particular location or entity within a group of entities. An aiming device is typically used in conjunction with a firearm or crew-served weapon, wherein the target marker 10 provides an intended point of impact of an associated projectile. When used as a designator, the target marker 10 is used as or with a target-tracking laser beam and for providing range data indicative of the range to the target. Each of these systems being known in the art, further description is not necessary.

Thus, "marking" encompasses aiming (aiming from one's own weapon), pointing (indicating for other's weapon system), locating (for conventional and coordinate-guided munitions) and/or designating (for laser-guided munitions).

The target marker 10 includes a housing 20, a quantum cascade laser 30, a driver 40, a collimating or focusing lens 60 and a power supply 70.

The housing 20 can be a handheld configuration or a firearm mounted configuration. The housing is selected to encompass the quantum cascade laser 30, the focusing lens 60, the driver 40 and the power supply 70. In one configuration, the housing 20 encompasses (retains) all the components required for operation of the quantum cascade laser 30. That is, the housing 20 provides the target marker 10 as a self-contained hand-held portable device.

It is contemplated, the housing 20 can include an aperture 21 for emission of a beam from the quantum cascade laser 30. In addition, the housing 20 can include apertures or ports 23 for control of the target marker 10 such as an on/off switch 24, as well as switches or controls for operating mode selections.

The housing 20 can be formed of any of a variety of rigid material such as composites, laminates, plastics or metals. In one configuration, the housing 20 is formed of an extruded aluminum, thereby providing sufficient strength without requiring significant weight. However, it is understood the housing 20 can be machined such as by EDM (electrical discharge machining) or molding if composites, laminates, plastics or even metals are employed for the housing.

In one configuration of the target marker 10, the housing 20 is configured to mount to any of a variety of handheld, side and small arms such as pistols, rifles, shotguns, automatic, semi-automatic arms, as well as bows, collectively referred to as firearms. The housing 20 can interface with any of a variety of clamping or mounting mechanisms such as a Weaver style, Picatinny rail or dove tail engagement.

The quantum cascade laser (QCL) 30 is a laser emitting structure retained within the housing 20 and configured via the collimating or focusing lens 60 made from appropriate materials, to produce a beam extending along a beam path. The beam path extends from the QCL 30, through a portion of the housing 20 to pass to the exterior of the housing. The QCL 30 is selected to operate in ambient temperature conditions while producing a beam having a wavelength between approximately 2 μm and 30 μm with a preferred wavelength of 2 to 5 μm or 8 to 30 μm.

Although a single quantum cascade laser 30 is shown in housing, it is contemplated a plurality of quantum cascade lasers can be disposed within the housing 20 or a single quantum cascade laser can be employed with an appropriate driver and filter to provide a plurality of corresponding wavelengths.

The QCL 30 includes electrical behavior of a semiconductor material which can be described with the band model, which states that various energy ranges, the energy bands, are available to the electrons of the semiconductor material, and that the electrons of the semiconductor material can essentially take on any energy value within the energy bands. Various bands can be separated from one another by a band gap, i.e., an energy band with energy values the electrons cannot possess. If an electron changes from a higher energy band to a lower energy band, energy corresponding to the difference of the energy values of the electron before and after the change, which is also called "transition", is released. The energy difference can be released in form of photons. The band with the highest bound-state energy level, which is fully filled with electrons at a temperature of 0° Kelvin, i.e., the so-called valence band, and the conduction band that is energetically above the valence band, which is unfilled at 0° Kelvin, as well as the band gap between them are of special significance for a semiconductor material.

In the cascades of quantum cascade lasers, the semiconductor materials for the barrier layers and the quantum wells are selected such that the lower conduction band edge of the barrier material lies higher in energy than the lower conduction band edge of the quantum well material. The lower conduction band edge represents the lowest energy value that an electron can assume within the conduction band. The energy difference between the energy of the lower conduction band edge of the barrier material and the lower conduction band edge of the quantum well material is also called the conduction band discontinuity. As a result of this selection, the electrons of the quantum wells cannot readily penetrate the barrier layers and are therefore enclosed in the quantum wells. The electrons can only "tunnel" through a barrier layer into an adjacent quantum well in a quantum-mechanical process, with the probability of the occurrence of a tunneling process depending on the height of the conduction band discontinuity and the thickness of the barrier layer between the two quantum wells.

In the quantum well, the behavior of the electrons enclosed in the well is determined by quantum mechanics effects due to the small thickness of the layer (only a few nanometers). An essential effect is that the electrons in an energy band of the quantum well can no longer assume any energy value within the energy range of the band, but rather are confined to the energy values of specific energy levels, i.e., sub-bands. The energetic differences between the individual sub-bands are particularly high if the quantum well is very thin and the conduction band discontinuity is high. The electron energy does not change continuously, but rather jumps from one sub-band to the next. The electron can change from one energy level to the other energy level only if the energy increase or the energy decrease suffered by an electron corresponds precisely to the difference of the energy values of two sub-bands. Transitions from one energy level to another energy level within one and the same band are called intersubband transitions. In the cascades of the quantum cascade laser, the emission of laser radiation occurs at these intersubband transitions.

QCLs 30 have been constructed to emit laser radiation in a wavelength spectrum of 3 μm to 100 μm with intersubband transitions in the lasers. J. Faist et al., IEEE journal of Quantum Electronics, Vol. 38, No. 6, July 2002, describes a quantum cascade laser that can emit laser radiation with a wave length of 5.3 μm at room temperature. The cascades of the quantum cascade laser described in the Faist article are applied to an InP (indium phosphide) substrate. The quantum wells are comprised of $In_{0.6}Ga_{0.4}As$ (indium-gallium-arsenide with 60% indium and 40% gallium) and its barrier layers are comprised of $In_{0.44}Al_{0.56}As$ (indium-aluminum-arsenide with 44% indium and 56% gallium).

For emission of wavelengths spectrum of 2.9-5.3 μm at room temperature, the QCL 30 as set forth in US2005/0213627 published Sep. 29, 2005 assigned U.S. application Ser. No. 11/061,727 filed Feb. 22, 2005 is hereby expressly incorporated by reference.

In one configuration, the quantum cascade laser 30 is hermetically sealed within the housing 20, thereby providing a controlled humidity and atmosphere for operation of the laser. Such hermetic sealing can include a subhousing or potting of the quantum cascade laser 30. The sealing can include a sealing of the housing 20, a sealing of the QCL 30 as the QCL is retained within the housing, or both.

In a further configuration, the quantum cascade laser 30 can be tuned to provide a beam of a specific wavelength. Tuning of the beam can be accomplished by locating a grating in the beam path. The grating can be adjustable to allow selective transmission of a given wavelength, or fixed to transmit only a single wavelength.

The driver 40 can be constructed to provide either pulsed or continuous wave (CW) operation of the QCL 30. The rise/fall time of the pulse, compliance voltage and current for QCL are selected to minimize power consumption and heat generation.

The driver 40 is located within the housing 20 and operably connected to the quantum cascade laser 30. Generally, the driver 40 includes a pulse generator, an amplifier and a pulse switcher.

Figure 3:
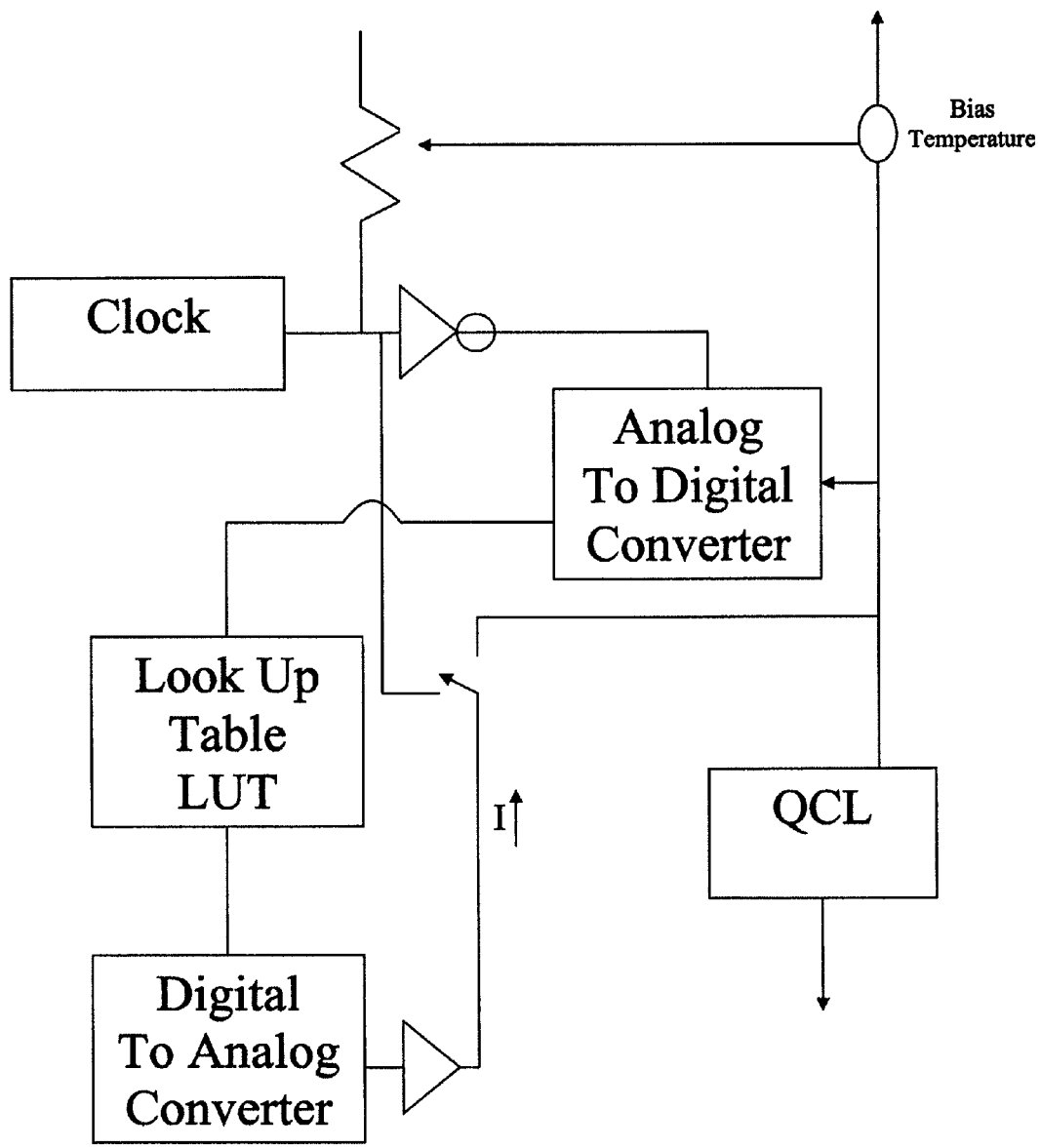
FIG. 3 is a schematic of the driver circuit of the target marker.

Alternatively, referring to FIG. 3, a schematic of the driver 40 operably connected to the QCL 30 is shown. In view of current QCL constructions, the driver 40 allows for operation as a pulsed laser, such as by passive switching. Although specific values depend upon the particular QCL and intended operating parameters, it is contemplated the peak power draw may be between approximately 1 to 10 amps, with an average current draw of approximately 0.01 to 0.1 amps. As the required voltage may be from approximately 9 to 12 volts, approximately 9 to 120 W may be consumed. This represents a substantial power consumption as well as heat generation.

A look up table LUT accommodates the temperature induced impedance changes of the QCL 30. Thus, the look up table LUT can be employed to modify control of an amplifier in the driver 40 in response to the temperature of the QCL 30. Depending upon the consistency of the QCL 30 (or uniformity of the QCL) in response to temperature changes, the look up table LUT may be determined for each individual QCL, and hence target marker 10, or for a given batch or set of QCLs. As described, one configuration contemplates that the look up table LUT can be burned to a flash memory. Thus, the appropriate compliance voltage to accommodate for temperature fluctuations of the QCL 30 are carried by the target marker 10 in the look up table LUT.

Further, it is contemplated the QCL 30 may be pulsed at frequencies less than a millisecond. However, it is understood depending upon the intended use and range of the target marker 10, the repetition rate and/or peak power can be at least factory set as needed. Further, in the configuration in which the laser is pulsed, the repetition rate and peak are selected to provide a sufficient beam that can be seen in the thermal imager 300 yet maintain operation of the target marker 10 at ambient temperatures. That is, sufficient heat dissipates prior to the next pulse.

The collimating or focusing lens 60 is disposed in the beam path such that in one configuration, the lens is retained within the housing. However, it is contemplated the lens 60 can form an interface between the interior and the exterior of the housing 20. The focusing lens 60 can be configured to focus the beam at a particular point. For example, the focusing lens 60 can be configured to focus the beam at a specified distance. In a further configuration, the focusing lens can be a dedicated collimator, thereby collimating the beam along the beam path. The lens 60 is formed of a material substantially transparent to the wavelength of the beam from the quantum cascade laser 30.

In an alternative configuration, a diffractive optic 80 can be located within the beam path to provide collimation of the beam. That is, the diffractive optic intersects the beam path such that the beam passes through or reflects off of the diffractive optic.

In one configuration, the power supply 70 includes at least one battery. Depending upon the anticipated power requirements, available space and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with the target marker 10. It is understood that any type of power supply 70, preferably portable and sufficiently small in size for use in a hand held device can be utilized. The battery type power supply can be disposable or rechargeable.

The power supply 70 is located within the housing. In one configuration, the housing includes a battery compartment sized to operably retain the batteries. In the firearm configuration of the target marker 10, the battery compartment is configured to accommodate any recoil associated with any discharge of the firearm. The battery compartment can be formed of a weather resistant, resilient material such as plastic and shaped to include receptacles for receiving the battery (ies) required for power. Further, the battery compartment be selectively closeable or sealable to prevent environmental migration into the compartment.

The power supply 70 is operably connected to the driver 40 and can be controlled by or utilized under driver commands. Thus, the amount of power from the power supply 70 can be controlled or varied to alter the output of the QCL 30.

In a further configuration, a temperature controller 90 can be disposed in thermal contact with the quantum cascade laser 30 and the exterior of the housing 20. The temperature controller 90 is employed to maintain the quantum cascade laser 30 at a desirable operating temperature. As certain configurations of the temperature controller 90 require energy input, it is advantageous that the housing 20, the quantum cascade laser 30 and the driver 40 be configured to minimize thermal demands on the temperature controller 90. The temperature controller 90 can be a passive device or an active device. A passive temperature controller includes heat sinks, radiators or fins to dissipate thermal energy from the target marker 10. Active temperature controllers encompass Peltier modules, Stirling devices as well as fans.

Alternatively, a thermocouple 50 can be thermally coupled to the QCL 30 to monitor the temperature, and the electronic look-up table LUT, such as one encoded in flash memory, can be used to control the driver 40 to achieve the desired optical output.

In a further configuration, the target marker 10 can be used with or incorporate an infrared laser (such as at 830 nm) for use with image intensifier devices and/or a visible laser (400 nm to 750 nm) such as HL6321 MG manufactured by Hitachi. The visible laser allows for a corresponding designator, pointing or aiming functions which are visible without requiring use of the thermal imager 300.

In a further configuration, the target marker 10 can include a receiver and a transmitter (or a transceiver) for receiving and transmitting information from a remote source. Such information can include targeting data, as well as strategic data, thereby allowing silent coordinated operations. As the images of the thermal imager 300 are dynamic, the communication with remote sources allows coordination between a remote locations. The transceiver is operably connected to the power supply. It is contemplated, the target imager 300, or a central controller can include a communicating transceiver with the target marker 10.

In a further configuration, the target marker 10 can be cooperatively employed with the thermal imager 300 and a secondary communication system 330. The secondary communication system 330 provides communication between a user of the target marker 10 and a user of the thermal imager 300 or a separate member in the secondary communication system 330.

The secondary communication system 330 can be a wired system either dedicated or open, wherein the signals can be selectively encrypted. In a further configuration, the secondary communication system 330 can include a wireless system operating at any of a variety of frequencies as well known in the art. Again, the signals over the secondary communication system 330 can be selectively encrypted, as known in the art. An exemplary secondary communication system 330 includes, but is not limited to, third-generation (3G) wireless systems and mobile communication services, which can incorporate video teleconferencing and web browsing. Such 3G systems offer full interoperability (global roaming) as a result of the international IMT-2000 standardization. Pursuant to radio interface specifications for IMT-2000, five required interfaces enabling interoperability include IMT-DS (Direct Spread), IMT-MC (Multi-Carrier), IMT-TC (Time Code), IMT-SC (Single Carrier), and IMT-FT (Frequency Time). UTRA (W-CDMA) and cdma2000 make up three of the five IMT-2000 radio interfaces. Both systems utilize code-division multiple access (CDMA) techniques. Alternatively, a Mil-spec compliant secondary communication system 330 can be employed.

Operation

The target marker 10 is energized by the power supply and a thermal infrared beam is projected along the beam path. The beam passes through the focusing lens and exits the housing. The housing is oriented to direct the beam to impinge or intersect the object of interest, such as a target.

As the beam intersects the target, portions of the beam are scattered or reflected by the surface of the target. A portion of the scattered or reflected beam are captured by the thermal imager 300 and a corresponding visual representation is created. It is also contemplated that as the beam intersects the target, a portion of the beam is absorbed by the target. The absorbed portion of the beam then reemits energy within the infrared wavelength which is visible by the target imager 300.

The target marker 10 is configured to provide an operable range on the order of a few hundreds of meters. However, as the technology of the thermal imager 300 improves, it is contemplated the target marker 10 can be modified by increasing the capacity of the quantum cascade laser 30 and power supply 70 to provide an operable range on the order of kilometers.

In those configurations employing multiple wavelengths for providing a fused system, the additional wavelengths are captured by corresponding imagers, wherein the corresponding images may be superimposed, blended or merged to provide a single depiction of the area of interest. Such single depiction can be on the thermal imager 300 or a separate display.

Further, as the thermal imager 300 can have a plurality of targets with an a field of view, the target marker 10 at a remote location can be activated and directed to intersect the beam with a selected one of the plurality of targets. Communication over the secondary communication system 330 can be employed to supplement the marking of the target by the remote target marker 10 as viewed on the thermal imager 300.

Although the present invention has been described in terms of particular embodiments, it is not limited to these embodiments. Alternative embodiments, configurations or modifications which will be encompassed by the invention can be made by those skilled in the embodiments, configurations, modifications or equivalents may be included in the spirit and scope of the invention, as defined by the appended claims.

The invention claimed is:

1. A portable target marker, comprising:
   a quantum cascade laser configured to generate a thermal infrared beam;
   a driver operably connected to the quantum cascade laser and configured to pulse the beam at a desired repetition rate, the pulsed beam intersecting a target; and
   a thermal imager configured to form a visible image of the pulsed beam intersecting the target.

2. The target marker of claim 1, further comprising a housing, wherein at least one of the driver and the quantum cascade laser is hermetically sealed within the housing.

3. The target marker of claim 1, further comprising a temperature controller in thermal contact with the quantum cascade laser and configured to maintain the quantum cascade laser at ambient temperature.

4. The target marker of claim 1, wherein the driver comprises at least one of a pulse generator, an amplifier, and a pulse switcher.

5. The target marker of claim 4, wherein the pulse switcher of the driver is configured to enable passive switching of the quantum cascade laser.

6. The target marker of claim 4, wherein the amplifier of the driver is controlled in response to a temperature of the quantum cascade laser.

7. The target marker of claim 1, further comprising a power supply operably connected to the driver and the quantum cascade laser, the driver being configured to alter the pulsed beam by varying an amount of power supplied to the quantum cascade laser by the power supply.

8. The target marker of claim 1, wherein a peak power draw of the quantum cascade laser is between approximately 1 amp and approximately 10 amps.

9. The target marker of claim 1, wherein an average current draw of the quantum cascade laser is between approximately 0.01 amps and approximately 0.1 amps.

10. The target marker of claim 1, wherein a voltage required by the quantum cascade laser is between approximately 9 Volts and approximately 12 Volts.

11. The target marker of claim 1, wherein the thermal imager is configured to capture a portion of the pulsed beam that has been at least one of scattered, reflected, absorbed, and reemitted by the target, and to form the visible image based on the captured portion.

12. The target marker of claim 11, wherein the target absorbs a portion of the pulsed beam and reemits energy in the thermal band corresponding to the absorbed portion, and
wherein the thermal imager is configured to capture the reemitted energy and to form the visible image based on the captured energy.

13. The target marker of claim 1, wherein the thermal imager is configured to capture energy emitted by the target in the thermal band, and to form the visible image based on the captured energy.

14. A method of marking a target with a portable target marker, comprising:
generating a thermal infrared beam with the target marker;
pulsing the beam at a desired repetition rate;
intersecting the pulsed beam with the target; and
forming a visible image of the pulsed beam intersecting the target.

15. The method of claim 14, wherein the target emits energy in the thermal band, and forming the visible image comprises capturing a portion of the energy emitted by the target.

16. The method of claim 14, wherein pulsing the beam at the repetition rate increases the visibility of the pulsed beam in the image relative to a portion of the target.

17. The method of claim 14, wherein forming the visible image comprises capturing a portion of the pulsed beam that has been at least one of scattered, reflected, absorbed, and reemitted by the target, and
forming the visible image based on the captured portion.

18. The method of claim 14, wherein the target absorbs a portion of the pulsed beam and reemits energy in the thermal band corresponding to the absorbed portion, and
wherein forming the visible image comprises capturing the reemitted energy and forming the visible image based on the captured energy.

19. The method of claim 14, wherein the pulsed beam has a wavelength between approximately 2 μm and approximately 30 μm.

20. A method of marking a target with a portable target marker, comprising:
generating a thermal infrared beam with a quantum cascade laser of the target marker;
pulsing the beam at a desired repetition rate;
intersecting the pulsed beam with the target such that a portion of the pulsed beam is at least one of scattered, reflected, absorbed, and reemitted by the target
capturing the portion of the pulsed beam with a thermal imager; and
forming, with the thermal imager, a visible image of the pulsed beam intersecting the target, wherein the repetition rate is selected based on an operating characteristic of the thermal imager.

* * * * *